United States Patent
Ye et al.

[11] Patent Number: 6,063,547
[45] Date of Patent: May 16, 2000

[54] PHYSICAL VAPOR DEPOSITION POLY-P-PHENYLENE SULFIDE FILM AS A BOTTOM ANTI-REFLECTIVE COATING ON POLYSILICON

[75] Inventors: Jianhui Ye; Mei Sheng Zhou, both of Singapore, Singapore

[73] Assignee: Chartered Semiconductor Manufacturing, Ltd., Singapore, Singapore

[21] Appl. No.: 09/094,464

[22] Filed: Jun. 11, 1998

[51] Int. Cl.[7] .................................................. G03F 7/26
[52] U.S. Cl. ........................... 430/313; 216/41; 430/950
[58] Field of Search .................... 430/311, 312, 430/313, 314, 316, 322, 323, 950; 216/99, 41

[56] References Cited

U.S. PATENT DOCUMENTS

| | | | |
|---|---|---|---|
| 5,169,494 | 12/1992 | Hashimoto et al. | 156/661.1 |
| 5,198,153 | 3/1993 | Angelopoulos et al. | 252/500 |
| 5,302,548 | 4/1994 | Watanabe et al. | 437/187 |
| 5,545,588 | 8/1996 | Yoo | 437/187 |

FOREIGN PATENT DOCUMENTS

7-165917   6/1995   Japan .

OTHER PUBLICATIONS

Petty et al. "An Introduction to Molecular Electronics ". First Ed. London, 1995, pp. 244–245.

*Primary Examiner*—Kathleen Duda
*Attorney, Agent, or Firm*—George O. Saile; Rosemary L. S. Pike; William J. Stoffel

[57] ABSTRACT

A method of patterning conductive lines using a bottom anti-reflective coating (BARC) composed of Poly-p-phenylene sulfide (PPS) film 30 formed using a Physical Vapor Deposition (PVD) process. The PPS BARC 30 is easy to remove and has superior planarization. The method comprises:

a) forming conductive layer 26 over a semiconductor structure 10;

b) forming a Poly-p-phenylene sulfide (PPS) layer 30 over said conductive layer using a Physical Vapor Deposition (PVD) process;

c) forming a photoresist pattern 34 over said Poly-p-phenylene sulfide (PPS) layer 30; said Poly-p-phenylene sulfide (PPS) layer acting as a bottom Anti-reflective coating (BARC);

d) etching said conductive layer 26 using said photoresist pattern 34 and as a mask forming a conductive pattern;

e) removing said photoresist pattern 34;

f) removing said Poly-p-phenylene sulfide (PPS) layer by heating and vaporizing said Poly-p-phenylene sulfide (PPS) layer.

19 Claims, 2 Drawing Sheets

Poly-p-Phenylene Sulphide (PPS)

PHYSICAL VAPOR DEPOSITION POLY-P-PHENYLENE SULFIDE FILM AS A BOTTOM ANTI-REFLECTIVE COATING ON POLYSILICON

BACKGROUND OF INVENTION

1) Field of the Invention

This invention relates generally to method of etching patterns in a conductive layer in a semiconductor device using a Poly-p-phenylene sulfide (PPS) bottom Anti-reflective coating (BARC) and more particularly to a method for forming Poly-p-phenylene sulfide (PPS) using Physical Vapor Deposition (PVD) as a bottom anti-reflective coating (BARC) over a polysilicon layer and etching the conductive layer.

2) Description of the Prior Art

A major challenge of semiconductor manufacturing is patterning layers of smaller dimensions. In order to pattern layers using light exposure photoresist processes, often a bottom anti-reflective coating (BARC) is formed over the layer to be patterned. The bottom anti-reflective coating (BARC) layer absorbs excess light that is reflected off the underlying layer thus preventing the reflected light from distorting the photoresist pattern.

Problem with current bottom anti-reflective coating (BARC) layers are (1) that the bottom anti-reflective coatings (BARC) are difficult to remove and (2) that CD (critical dimensions) are difficult to control. Conventional bottom anti-reflective coating (BARC) layer are formed of SiON (silicon oxynitride) and organic materials such as organic polymers. BARC layers composed of SiON or organic material are currently removed using wet cleaning. The problem with this process is that residues are formed and polysilicon CD control is not adequate.

Another problem with current BARC process is the inadequate planarization. Inorganic and organic BARCs are usually formed by CVD and spin-coating. The formed layers have non-uniformity in which thickness of edge is larger than in the center.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,169,494 (Hashimoto): Fine pattern forming method—shows a method of forming a three layer pattern having a bottom electrically conducting organic polymer, a middle inorganic film and a top e-beam resist layer (electrically conductive).

U.S. Pat. No. 5,302,548(Watanabe), U.S. Pat. No. 5,198, 153(Angelopoulos), and U.S. Pat. No. 5,545,588(Yoo) shows other photolithographic processes. The book, An Introduction to Molecular Electronics, Edited by Michael C. Petty, Martin R. Bryce and David Blour, First Edition, Edwird Arnold, London (1995), M. Hara and S. Sasabe, Chapter 11, "Organic Molecular Beam Epitaxy", p244–245, discuss techniques for forming ultra thin films.

There is a need for an improved process of patterning polysilicon and polycide structures that allow easier bottom anti-reflective coating (BARC) photoresist removal and better planarization.

SUMMARY OF THE INVENTION

It is an object of the present invention to provide a method for patterning a conductive layer, such as polysilicon or polycide, using a BARC layer that is easy to remove and planarize.

It is an object of the present invention to provide a method for patterning a conductive layer, such as polysilicon or polycide, using a BARC layer formed by a Physical Vapor Deposition (PVD) technique using Poly-p-phenylene sulfide (PPS).

It is an objective of the present invention to better control polysilicon CD, using a bottom anti-reflective coating (BARC) layer formed by a Physical Vapor Deposition (PVD) technique using poly-p-phenylene sulfide (PPS).

To accomplish the above objectives, the present invention provides a method that uses a PVD poly-phenylene sulfide (PPS) film as a bottom anti-reflective coating (BARC) on polysilicon or polycide.

A method of etching patterns in conductive layers comprising the steps of:

a) FIG. 2—forming conductive layer 26 over a semiconductor structure 10;

b) forming a Poly-p-phenylene sulfide (PPS) layer 30 over the conductive layer;
   (1) the Poly-p-phenylene sulfide (PPS) layer 30 formed using a Physical Vapor Deposition (PVD) process comprising heating a Poly-p-phenylene sulfide (PPS) source;

c) forming a photoresist pattern 34 over the Poly-p-phenylene sulfide (PPS) layer 30; the Poly-p-phenylene sulfide (PPS) layer acting as a bottom Anti-reflective coating (BARC)

d) FIG. 2—etching the conductive layer 26 using the photoresist pattern 34 as a mask forming a conductive pattern;

e) FIG. 3—removing the photoresist pattern 34;

f) FIG. 4—removing the Poly-p-phenylene sulfide (PPS) layer; the removal of the Poly-p-phenylene sulfide (PPS) layer performed by heating the Poly-p-phenylene sulfide (PPS) layer to a temperature of between about 250 and 500° C., and at a pressure between about $10^{-5}$ and $10^{-9}$ torr, and vaporizing the Poly-p-phenylene sulfide (PPS) layer.

The PPS BARC layer of the present invention provides the following advantages:

The PPS BARC layer is easy to apply with the invention's Physical Vapor Deposition (PVD) method and completely removed using invention's the heating and vaporization process The PPS BARC has superior planarization. PPS film can be formed by heating PPS source in a vacuum environment and has highly crystalline structure or nearly single-crystalline structure with ca. 10 nm thickness. That is, the film is formed layer by layer. It greatly improves the problems of planarization that normal inorganic or organic BARC has.

The PPS BARC provides better line width control over topography, which is an issue encountered as organic BARC is used.

The PPS BARC makes CD control more precisely because the PPS film has high etch resistance in RIE etch.

Allows the use of very thin layers of PPS film to eliminate or minimize etch bias.

Enables the use of any lithographic process and etch process.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a BARC layer composed of Physical Vapor Deposition (PVD) Poly-p-phenylene sulfide (PPS).

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not be described in detail in order to not unnecessarily obscure the present invention.

It should be recognized that many publications describe the details of common techniques used in the fabrication process of integrated circuit components. See, E.g., C. Y. Chang, S. M. Sze, in *ULSI Technology*, by The McGraw-Hill Company, Inc. copyright 1997. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

The method of the invention is summarized in the table below:

TABLE

Overview of the invention's PPS BARC layer 30 and conductive layer patterning

Figure 2:
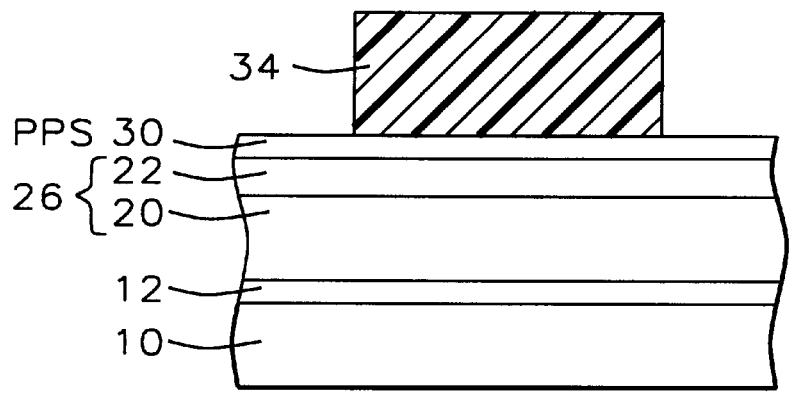
FIGS. 2, 3, 4, and 5 are cross sectional views for illustrating a method for patterning a conductive layer using the invention's PPS BARC layer according to the present invention.
Figure 3:
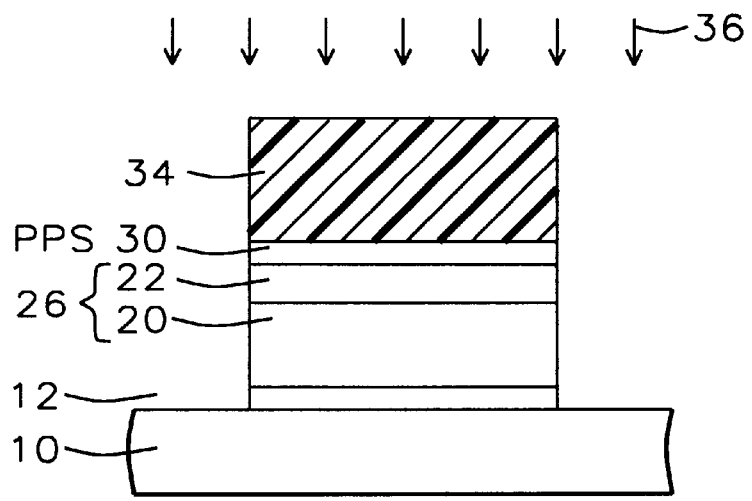
Figure 4:
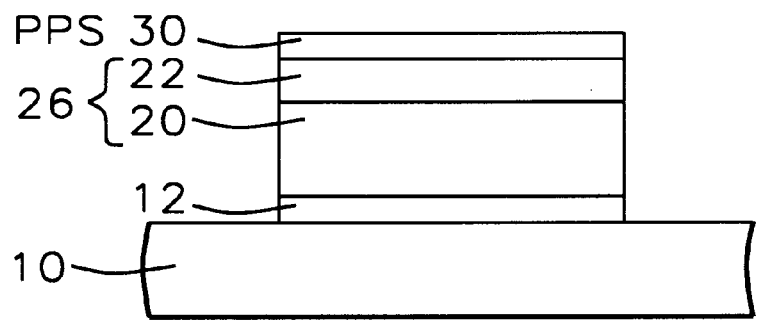
Figure 5:
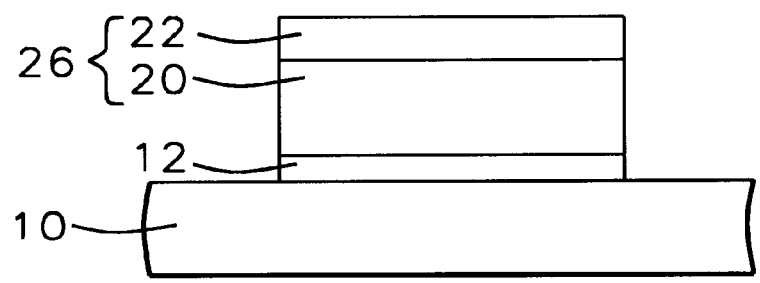

| Step | Process | Important parameters |
|---|---|---|
| 1 | FIG. 2 - forming conductive layer 26 over a semiconductor structure 10; | layer 26 is a lower polysilicon layer 20 and an upper polycide layer 22; |
| 2 | forming a Poly-p-phenylene sulfide (PPS) layer 30 over the conductive layer; | the PPS layer 30 formed using a PVD process by heating a PPS source at a crucible temperature of about 400° C.) and a substrate temperature of tgt = 400° C., at a pressure about 1E-6 torr and the PPS layer thickness between 70 Å and 5000 Å; |
| 3 | forming a photoresist pattern 34 over the Poly-p-phenylene sulfide (PPS) layer 30; the Poly-p-phenylene sulfide (PPS) layer acting as a bottom Anti-reflective coating (BARC); | The PR layer exposed with a Light in the wavelength between 100 and 500 nm |
| 4 | FIG. 3 - etching the conductive layer 26 using the photoresist pattern 34 and as a mask forming a conductive pattern; | The conductive layer 26 is etched by using $Cl_2$, $O_2$, HBr gasses in a polysilicon etcher (e.g., LAM TCP 9400) |
| 5 | FIG. 4- removing the photoresist pattern 34;. | the removal of the photoresist pattern 34 comprises using a $CF_4$ and $O_2$ ashing process |
| 6 | FIG. 5 - removing the Poly-p-phenylene sulfide (PPS) layer | (a) heating the PPS layer to a temperature of 400° C., a pressure of $10^{-6}$ torr and vaporizing the Poly-p-phenylene sulfide (PPS) layer. |

A summary of the elements shown in the Figs is shown below:

TABLE

Elements

| Element | Layer |
|---|---|
| 10 | semiconductor substrate |
| 12 | Thermal silicon oxide (pad oxide) |
| 20 | Polysilicon |
| 22 | Polycides |
| 30 | PPS bottom anti-reflective coating (BARC)* Invention** |
| 34 | Photoresist |
| 36 | RIE plasma Etch |

The invention is a method for forming Poly-p-phenylene sulfide (PPS) using Physical Vapor Deposition (PVD) as a bottom anti-reflective coating (BARC) over a conductive layer 26 and patterning /etching the conductive layer 26.

FIG. 2 shows the step of forming a conductive layer 26 (e.g., first layer) over a semiconductor structure 10. The semiconductor structure 10 is understood to possibly include a semiconductor wafer, active and passive devices formed within the wafer and layers formed on the wafer surface. The term "semiconductor structure" is meant to include devices formed within a semiconductor wafer and the layers overlying the wafer.

FIG. 2 shows an oxide layer 12 (pad oxide) as part of the semiconductor structure 10. The oxide layer preferably has a thickness in a range of between about 20 and 100 Å. Oxide layer can be a gate oxide for a gate of a FET.

The conductive layer 26 can be composed of a polysilicon having a thickness in a range of between about 500 and 3000 Å. The conductive layer be composed of a two layer structure with a lower polysilicon layer 20 and an upper polycide layer 22.

The PPS layer 30 can be formed over underlying layers 20 22 26 made of other materials in addition to polysilicon and polycide such as, dielectric layers (and stacks of conductive and dielectric layers) and oxide, spin-on-glass (SOG), TEOS oxides or other silicides such as TiSix or CoSix. The first (e.g., conductive) layer 26 can be composed of other conductive materials commonly used in semiconductor manufacturing, such as Al—Cu alloys, silicon nitride (SiN). The underlying conductive layer does not determine the crystal structure of overlying PPS layer 30.

Invention's PPS BARC Layer 30 Formed by PVD

Figure 1:
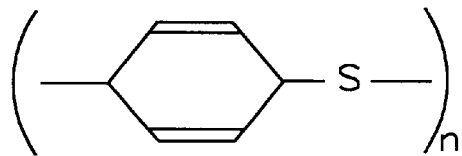
FIG. 1 is a structural representation of Poly-p-phenylene sulfide (PPS).

Still referring to FIG. 2, in a key step, a Poly-p-phenylene sulfide (PPS) layer 30 is formed over the conductive layer 26. FIG. 1 shows the chemical structure of Poly-p-phenylene sulfide (PPS). (Note that PPS is spelled two different ways in literature as both Poly-p-phenylene sulphide (PPS) (See *An Introduction to Molecular Electronics*, Edited by Michael C. Petty, Martin R. Bryce and David Blour, First Edition, Edwird Arnold, London (1995), p245) and Poly-p-phenylene sulfide (PPS) (See U.S. Pat. No. 5,169,494 Col 3., line 17). Note that in contrast to the prior art, the invention's PPS layer is not a photoresist layer with PPS as one ingredient in the photoresist layer.

The Poly-p-phenylene sulfide (PPS) layer is preferably formed using a Physical Vapor Deposition (PVD) process comprising heating and evaporating a Poly-p-phenylene sulfide (PPS) source at a crucible temperature in a range of between about 250 and 500° C. (and more preferably between 375 and 425° C.) and a semiconductor structure 10 (e.g., substrate) temperature in a range of between about 150 and 300° C., and at a pressure in a range of between about $10^{-5}$ and $10^{-9}$ torr (tgt=1E-6 torr).

The PPS layer may be formed by any other processes, such as Laser ablation as these techniques develop in the future. However, the invention's PPS Physical Vapor Deposition (PVD) process has been found superior to all other PPS layer processes. It is important to achieve the correct molecular weight and structure using the invention's Physical Vapor Deposition (PVD) process.

The Poly-p-phenylene sulfide (PPS) layer preferably has a thickness in a range of between about 70 Å and 5000 Å and more preferably a thickness in a range of between about 200 and 5000 Å. The PPS layer preferably has crystalline orientation and has a molecular weight between 5000 and 20,000 atomic mass units (AMU).

As shown in FIG. 2, a photoresist layer 34 is formed over the Poly-p-phenylene sulfide (PPS) layer 30.

The photoresist layer 34 is preferably composed of Resin+PAC (Photoacid compound) for g-line and I-line; and Resin+DAG (Photoacid generator) for DUV. The photoresist preferably has a thickness in a range of between about 3000 and 5000 Å.

The photoresist layer is patterned by exposing the photoresist layer to (light, e-beam, etc)g-line, I-line, DUV light at a preferred wavelength between about 100 and 500 nm, and developing the photoresist layer to form a photoresist pattern 34 over the Poly-p-phenylene sulfide (PPS) layer 32. The Poly-p-phenylene sulfide (PPS) layer acting as a bottom Anti-reflective coating (BARC). The photoresist layer is then developed to form a photoresist pattern.

The invention's PPS BARC layer improves the photo process accuracy. This is because the charge accumulated in the photoresist from incident electron can be transferred to the PPS BARC layer, which becomes more conductive. This prevents the etching profile of layer 26 from disturbance due to charge accumulation.

The Polysilicon and polycides gates in the 0.25 to 0.18 $\mu$m regime require a BARC layer.

Referring to FIG. 3, the conductive layer is etched using the photoresist pattern 34 as a mask forming a conductive pattern 26.

A preferred etch of the polysilicon and tungsten polycide layers 20 22 is a comprises the following plasma gases $Cl_2$, $O_2$, and HBr.

As shown in FIG. 4, the photoresist pattern is removed. The photoresist pattern 34 can be removed using any normal photoresist removal process including an ashing process. The removal of the photoresist pattern 34 preferably comprises using a $CF_4$ and $O_2$ ashing process.

Referring to FIG. 5, the removal of the Poly-p-phenylene sulfide (PPS) layer is preferably performed by heating the Poly-p-phenylene sulfide (PPS) layer to a temperature of between about 390 and 410° C., and at a pressure between about $10^{-5}$ and $10^{-9}$ torr and vaporizing the Poly-p-phenylene sulfide (PPS) layer. The PPS vapor is pumped out of the tool. The most important steps in the invention are shown in the table below:

TABLE

| STEP | FIGS. | REASON STEP IS IMPORTANT |
| --- | --- | --- |
| Formation of PPS layer 30 | 2 & 3 | Uniform PPS film 30 is formed on layer 22 by heating in PPS source in a vacuum (Physical Vapor Deposition (PVD)) |
| Removal of PPS layer | 4 | All PPS film is evaporated and completely removed by heating the substrate. |

The invention provides the following benefits:

The PPS bottom anti-reflective coating (BARC) is easy to remove using the heating vaporization process. The PPS layer overcomes the problem of the prior art's organic and inorganic BARC layers which are difficult to remove.

The PPS BARC layer is easy to apply with the invention's Physical Vapor Deposition (PVD) method and completely removed using invention's the heating and vaporization process The PPS BARC has superior planarization. PPS film can be formed by heating PPS source in a vacuum environment and has highly crystalline structure or nearly single-crystalline structure with ca. 10 nm thickness. That is, the film is formed layer by layer. It greatly improves the problems of planarization that normal inorganic or organic BARCs have.

The PPS BARC provides better line width control over topography, which is an issue encountered as organic BARC is used.

The PPS BARC makes CD control more precisely because the PPS film has high etch resistance in RIE etch.

Allows the use of very thin layers of PPS film to eliminate or minimize etch bias.

Enables the use of any lithographic process and etch process.

It is well known there are two kinds of BARCS, i.e., inorganic and organic BARCs. The advantages and disadvantages are listed in the table below for comparison:

TABLE

Comparison of the Invention's PPS BARC with organic and inorganic BARC layers

| BARC Type | Advantages | Disadvantages |
|---|---|---|
| Inorganic BARC | (a) thin film<br>(b) n, K adjustable<br>(c) uniform | (a) hard to etch<br>(b) strong thin film interference effects<br>(c) hard to remove<br>(d) standing waves |
| Organic BARC | (a) high adsorbance to reduce interference effects<br>(b) eliminating standing waves<br>(c) high etch rate<br>(d) easy to strip | (a) large topology<br>(b) less thermal stable <200° C.<br>(c) non-uniform<br>(d) poor planarization |
| Invention's PPS BARC | (a) film thickness easily adjustable (7 to 500 nm)<br>(b) uniform<br>(c) easy to deposit and remove<br>(d) high thermal stability (400° C.)<br>(e) better line width control over topology | |

It should be noted that while the invention's PPS layer has been illustrated in patterning (PR define and etch) of a conductive layer 26, the invention's PPS BARC layer can be used to pattern other materials in semiconductors, such as dielectrics (e.g., oxide, SOG etc) and other conductive and semiconductive layers and multi-layer stacks of these layers. The invention can be used wherever improved Photolithography performance is needed in semiconductor manufacturing.

While the invention has been particularly shown and described with reference to the preferred embodiments thereof, it will be understood by those skilled in the art that various changes in form and details may be made without departing from the spirit and scope of the invention.

What is claimed is:

1. A method of etching patterns in layers in semiconductor devices comprising the steps of:
   a) forming a first layer over a semiconductor structure;
   b) forming a Poly-p-phenylene sulfide (PPS) layer over said first layer;
   c) forming a photoresist pattern over said Poly-p-phenylene sulfide (PPS) layer; said Poly-p-phenylene sulfide (PPS) layer acting as a bottom Anti-reflective coating (BARC);
   d) etching said first layer using said photoresist pattern as a mask forming a first pattern;
   e) removing said photoresist pattern;
   f) removing said Poly-p-phenylene sulfide (PPS) layer.

2. The method of claim 1 wherein said first layer is comprised of polysilicon.

3. The method of claim 1 wherein said first layer is a multi-layer stack.

4. The method of claim 1 wherein said first layer is comprised of a material selected from the group consisting of conductive and dielectric substances.

5. The method of claim 1 wherein said first layer is composed of a two layer structure having a lower polysilicon layer and an upper polycide layer.

6. The method of claim 1 wherein said first layer composed of a material selected from the group consisting of polycide, titanium silicide, cobalt silicide, aluminum alloys, polysilicon, spin-on-glass, and silicon oxide.

7. The method of claim 1 wherein said Poly-p-phenylene sulfide (PPS) layer is formed using a Physical Vapor Deposition (PVD) process comprising heating a Poly-p-phenylene sulfide (PPS) source at a crucible temperature in a range of between about 250 and 500° C., and a semiconductor structure temperature in a range of between about 150 and 300° C. ,at a pressure in a range of between about $10^{-5}$ and $10^{-9}$ torr, and said Poly-p-phenylene sulfide (PPS) layer has a thickness in a range of between about 200 Å and 2000 Å; and the Poly-p-phenylene sulfide (PPS) layer has a crystalline structure and said Poly-p-phenylene sulfide (PPS) having a molecular weight between about 5000 and 20,000 atomic mass units (AMU).

8. The method of claim 1 wherein said photoresist pattern is formed by exposing a photoresist layer over said Poly-p-phenylene sulfide (PPS) layer to light at a wavelength in a range of between about 100 and 500 nm, and developing the photoresist layer to form said photoresist pattern.

9. The method of claim 1 wherein the removal of said photoresist pattern comprises using a $CF_4$ and $O_2$ ashing process.

10. The method of claim 1 wherein the removal of said Poly-p-phenylene sulfide (PPS) layer is performed by heating said Poly-p-phenylene sulfide (PPS) layer to a temperature of between about 390 and 410° C., and at a pressure between about $10^{-5}$ and $10^{-9}$ torr, and vaporizing said Poly-p-phenylene sulfide (PPS) layer.

11. A method of etching patterns in conductive layers comprising the steps of:
   a) forming a conductive layer over a semiconductor structure;
   b) forming a Poly-p-phenylene sulfide (PPS) layer consisting of PPS over said conductive layer; said Poly-p-phenylene sulfide (PPS) layer formed using a Physical Vapor Deposition (PVD) process;
   c) forming a photoresist pattern over said Poly-p-phenylene sulfide (PPS) layer; said Poly-p-phenylene sulfide (PPS) layer acting as a bottom Anti-reflective coating (BARC);
   d) etching said conductive layer using said photoresist pattern as a mask forming a conductive pattern;
   e) removing said photoresist pattern; and
   f) removing said Poly-p-phenylene sulfide (PPS) layer using a heating process.

12. The method of claim 11 wherein said conductive layer is composed of a two layer structure with a lower polysilicon layer and an upper polycide layer.

13. The method of claim 11 wherein said Poly-p-phenylene sulfide (PPS) layer formed using a Physical Vapor Deposition (PVD) process comprising heating a Poly-p-phenylene sulfide (PPS) source at a crucible temperature in a range of between about 250 and 500° C. and a semiconductor structure temperature in a range of between about 150 and 300° C. at a pressure in a range of between about $10^{-5}$ and $10^{-9}$ torr, and said Poly-p-phenylene sulfide (PPS) layer has a thickness in a range of between about 200 Å and 2000 Å; and the PPS layer has a crystalline structure and said Poly-p-phenylene sulfide (PPS) having a molecular weight between about 5000 and 20,000 atomic mass units (AMU).

14. The method of claim 11 wherein said photoresist pattern is formed by exposing a photoresist layer over said Poly-p-phenylene sulfide (PPS) layer to light at a wavelength in a range of between about 100 and 500 nm, and developing the photoresist layer to form said photoresist pattern.

15. The method of claim 11 wherein the removal of said photoresist pattern comprises using a $CF_4$ and $O_2$ ashing process.

16. The method of claim 11 wherein the removal of said Poly-p-phenylene sulfide (PPS) layer performed by heating said Poly-p-phenylene sulfide (PPS) layer to a temperature of between about 390 and 410° C., and at a pressure between about $10^{-5}$ and $10^{-9}$ torr, and vaporizing said Poly-p-phenylene sulfide (PPS) layer.

17. A method of etching patterns in conductive layers comprising the steps of:
 a) forming a conductive layer over a semiconductor structure;
 b) forming a Poly-p-phenylene sulfide (PPS) layer consisting of PPS over said conductive layer; said Poly-p-phenylene sulfide (PPS) layer is formed using a Physical Vapor Deposition (PVD) process;
  said Poly-p-phenylene sulfide (PPS) layer formed using a Physical Vapor Deposition (PVD) process comprising heating a Poly-p-phenylene sulfide (PPS) source at a crucible temperature in a range of between about 250 and 500° C., and a semiconductor structure temperature in a range of between about 150 and 300° C., at a pressure in a range of between about $10^{-5}$ and $10^{-9}$ torr, and said Poly-p-phenylene sulfide (PPS) layer has a thickness in a range of between about 200 Å and 2000 Å; and the PPS layer has a crystalline structure and said Poly-p-phenylene sulfide (PPS) having a molecular weight between about 5000 and 20,000 atomic mass units (AMU);
 c) forming a photoresist pattern over said Poly-p-phenylene sulfide (PPS) layer; said Poly-p-phenylene sulfide (PPS) layer acting as a bottom Anti-reflective coating (BARC);
  said photoresist pattern is formed by exposing a photoresist layer over said Poly-p-phenylene sulfide (PPS) layer to light at a wavelength in a range of between about 100 and 500 nm, and developing the photoresist layer to form said photoresist pattern;
 d) etching said conductive layer using said photoresist pattern as a mask forming a conductive pattern;
 e) removing said photoresist pattern; and
 f) removing said Poly-p-phenylene sulfide (PPS) layer using a heating process; the removal of said Poly-p-phenylene sulfide (PPS) layer performed by heating said Poly-p-phenylene sulfide (PPS) layer to a temperature of between about 390 and 410° C., and at a pressure between about $10^{-5}$ and $10^{-9}$ torr, and vaporizing said Poly-p-phenylene sulfide (PPS) layer.

18. The method of claim 17 wherein said conductive layer is composed of a two layer structure with a lower polysilicon layer and an upper polycide layer.

19. The method of claim 17 wherein the removal of said photoresist pattern comprises using a $CF_4$ and $O_2$ ashing process.

* * * * *